United States Patent
Watanabe

(10) Patent No.: US 8,446,196 B2
(45) Date of Patent: May 21, 2013

(54) INPUT INTERFACE CIRCUIT

(75) Inventor: Kazuo Watanabe, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 258 days.

(21) Appl. No.: 12/801,482

(22) Filed: Jun. 10, 2010

(65) Prior Publication Data

US 2011/0043262 A1   Feb. 24, 2011

(30) Foreign Application Priority Data

Aug. 19, 2009   (JP) .................................. 2009-190102

(51) Int. Cl.
*H03L 7/06*   (2006.01)
(52) U.S. Cl.
USPC ........................................................ 327/158
(58) Field of Classification Search
USPC ........................................................ 327/158
See application file for complete search history.

(56) References Cited

U.S. PATENT DOCUMENTS

2001/0052808 A1 *  12/2001  Hamamoto et al. .......... 327/291

FOREIGN PATENT DOCUMENTS

JP   2008-71018 A   3/2008

* cited by examiner

*Primary Examiner* — Daniel Rojas
(74) *Attorney, Agent, or Firm* — McGinn IP Law Group, PLLC

(57) ABSTRACT

An input interface circuit according to the present invention includes an input first stage circuit that is connected to a signal terminal, where the signal terminal receives external data, and a phase adjustment circuit that adjusts an external input clock and a latch timing signal to be in phase, where the latch timing signal is output to latch circuits included in the input first stage circuit. The phase adjustment circuit adjusts delay time of the latch timing signal that passes through the clock tree circuit and is supplied to the latch circuit in response to a comparison result between the clock and an output from a replica delay circuit which is replicated from the clock.

4 Claims, 12 Drawing Sheets

INPUT INTERFACE CIRCUIT

INCORPORATION BY REFERENCE

This application is based upon and claims the benefit of priority from Japanese patent application No. 2009-190102, filed on Aug. 19, 2009, the disclosure of which is incorporated herein in its entirety by reference.

BACKGROUND

1. Field of the Invention

The present invention relates to an interface technology of a semiconductor memory apparatus, and particularly to an input interface circuit.

2. Description of Related Art

The operating speed of the data communication between devices is increasing along with the rapid advancement of high-speed interface technology. In recent years, the operating speed of the data communication between input and output interface circuits of each device exceeds 1 GHz.

Especially in the interface between a synchronous memory and a CPU, the synchronous memory is configured receive a clock signal output from the CPU and a data signal synchronized with the clock signal, and latch the data signal using rising and falling edges of the clock signal.

FIG. 11 illustrates a general input circuit concerning the present invention. An input interface circuit 300 illustrated in FIG. 11 includes input first stage circuits 61 and 63, a clock tree circuit (CTS) 64, a clock tree replica circuit (CTS replica) 62, and latch circuits 65 and 66. FIG. 11 illustrates the configuration to latch the data supplied from DQi using latch circuits 2 and 3. Note that FIG. 12 illustrates a buffer as the input first stage circuits 61 and 63.

FIG. 13 illustrates waveforms of an externally supplied clock signal, data (DQi signal), and internal signals in the input interface circuit 300.

A DDR interface receives the data (DQi signal) having the phase shifted by 90 degrees with respect to the input clock (CLK). Further, as the system of the DDR interface is to latch multiple addresses and data input using clocks of one CLK pin, CLK must be distributed to each address and data.

By distributing CLK, the clock delay (delay added while passing through the CTS 64 illustrated in FIG. 11) indicated by t6 is added to the CLK line. Therefore, in order to normally latch the data using the latch circuits 65 and 66, it is necessary to add the equivalent amount of delay as the delay added to the CLK line (the delay indicated by t7) also to the data (which is the delay added by passing through the CTS replica 62 illustrated in FIG. 11). This is because that the latch circuits 65 and 66 need to ensure sufficient setup characteristics indicated by t8, and the hold characteristics indicated by t9 for rising and falling edges of CLK.

Japanese Unexamined Patent Application Publication No. 2008-71018 discloses a memory interface circuit for latching a data signal of a synchronous memory. FIG. 14 is a block diagram illustrating the memory interface circuit disclosed in Japanese Unexamined Patent Application Publication No. 2008-71018.

In FIG. 14, 211 is a DDR SDRAM, 212 is a DQS signal, 213a and 213b are data signals, 215 is an input buffer, 216 is a delay circuit, 217 is a data latch, 221 is a memory interface circuit, 222 is a read clock generation circuit, 223 is a main state machine, 257 is a data strobe signal, 253 is a read clock, 250 is an oscillation circuit, 260 is a phase comparator, and 262 is a control circuit.

The DDR SDRAM 211 synchronizes with the clock and outputs the DQS signal 212 and the data signal 213. The memory interface circuit 221 can be connected to the DDR-SDRAM 211. The delay circuit 216 delays the clock output from the oscillation circuit 250, and outputs the clock as the read clock 253. The phase comparator 260 measures the phase difference between the received data strobe signal 257 and the read clock 253. The delay circuit 216 adjusts the delay time of the read clock 253 according to the measured phase difference. The data latch 217 synchronizes with the read clock 253 to obtain the data signal 213. Then the memory interface circuit 221 disclosed in Japanese Unexamined Patent Application Publication No. 2008-71018 can perform stable and highly reliable data signal latch operation even under the deterioration and mismatch of the transmission conditions.

SUMMARY

However, in the general DDR input interface illustrated in FIG. 11, after amplifying the level of the data signal DQi using the buffer illustrated in FIG. 12, the amount of delay corresponding to the one added when passing through the CTS 64 is added in the CTS replica 62, so as to latch the data by the latch circuits 65 and 66. Thus, the present inventor has found a problem that passing through the buffer and the clock delay deteriorates the effective setup and hold characteristics which are needed for the latch circuit 65 and 66. That is, in an ideal circuit, it is ideal to be "t10=t8" and "t11=t9" in FIG. 13. However in an actual circuit, due to the variation and power supply fluctuation of the transistors, they usually are "t10>t8" and "t11>t9".

Further, addition of the amount of delay leads to increase the cause to deteriorate t8 and t9. This could bring a significant deterioration of the setup and hold characteristics.

Also in the memory interface circuit 221 disclosed in Japanese Unexamined Patent Application Publication No. 2008-71018, by the data signal line 213a passing through the input buffer 215, the effective setup and hold characteristics are deteriorated. Incidentally, as the internal oscillation circuit 250 is used, jitter and duty cycle distortion are generated independently from the clock input signal 212 and the internal oscillation circuit 250. This also leads to the deterioration of the setup and hold characteristic.

An exemplary aspect of the present invention is an input interface circuit that includes an input first stage circuit that is connected to a signal terminal, where the signal terminal receives external data, and a phase adjustment circuit that adjusts an external input clock and a latch timing signal to be in phase, where the latch timing signal is output to a latch circuit included in the input first stage circuit. The phase adjustment circuit adjusts delay time of the latch timing signal that passes through the clock tree circuit and is supplied to the latch circuit in response to a comparison result between the clock and an output from a replica delay circuit which is replicated from the clock.

The above input interface circuit enables to suppress jitter and duty cycle distortion generated in the delay circuit, thereby favorably ensuring the effective setup and hold characteristics which are needed for the latch circuits.

The present invention provides an input interface circuit that can favorably ensure the effective setup and hold characteristics.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Figure 1:
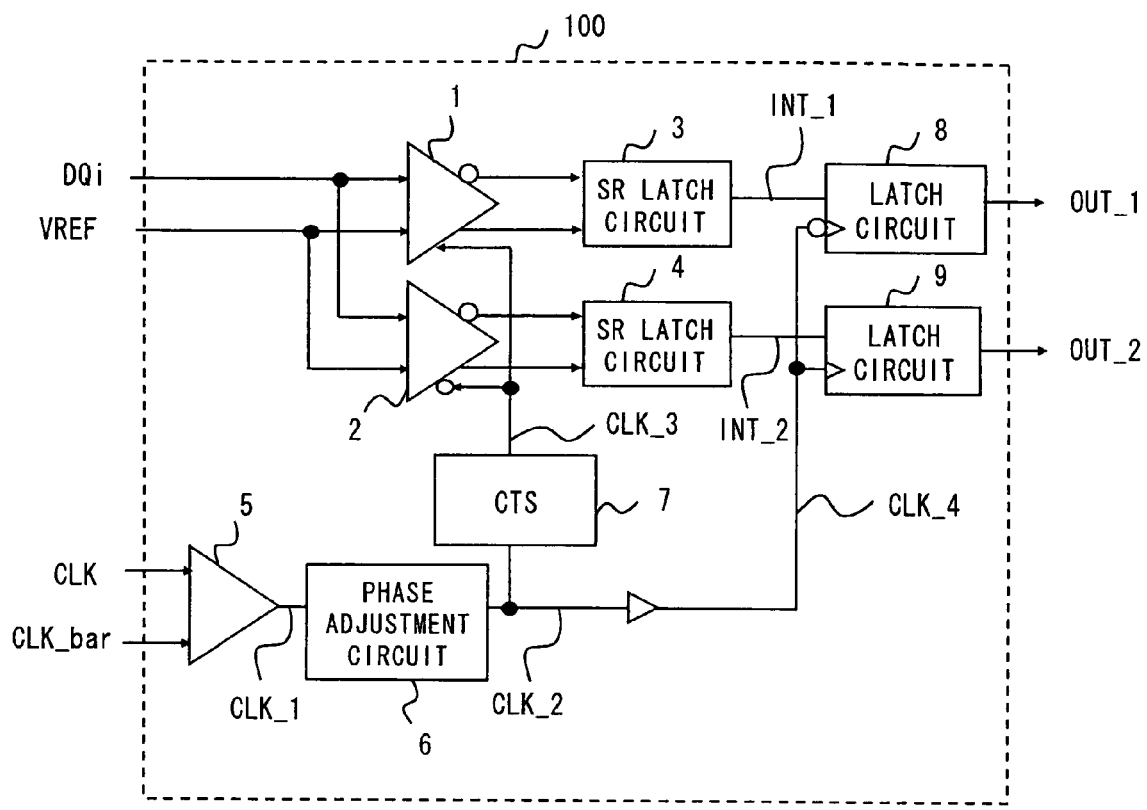
FIG. 1 is a block diagram illustrating an input interface circuit according to a first exemplary embodiment.

The best mode for carrying out the present invention is described in detail hereinafter with reference to the drawings. For the clarity of the explanation, the following explanation and drawings are omitted and simplified as appropriate. In the drawings, components with identical configuration or function are denoted by the same symbols with detailed description omitted.

First Exemplary Embodiment

FIG. 1 is a block diagram illustrating an input interface circuit according to the first exemplary embodiment. An input interface circuit 100 is connected to a DDR memory (not illustrated), and receives a DQi signal and a data signal synchronized with the clock (CLK).

The input interface circuit 100 includes input first stage circuits 1 and 2, SR latch circuits 3 and 4, an input first stage circuit 5, a phase adjustment circuit 6, a clock tree circuit (CTS) 7, a latch circuit 8 which latches data at falling edges, and a latch circuit 9 which latches data at rising edges. In FIG. 1, a latch type input first stage circuit corresponds to the input first stage circuits 1 and 2, and the SR latch circuits 3 and 4.

The input first stage 1 synchronizes with a rising edge of CLK_3, compares the signal levels of the external terminal DQi with that of an external VREF terminal, and outputs a comparison result. The input first stage circuit 1 amplifies the comparison result between the signal levels of the DQi signal and the VREF signal (for example, middle potential of the amplitude level of the DQi signal) at a rising edge of CLK_3. The amplified signal level is latched by the SR latch circuit 3 in one cycle from a rising edge to the next rising edge of the CLK_3 signal.

The input first stage 2 synchronizes with a falling edge of CLK_3, compares the signal levels of the external terminal DQi with that of the external VREF terminal, and outputs a comparison result. The input first stage circuit 2 amplifies the comparison result of the signal levels of the DQi signal and the VREF signal at a falling edge of CLK_3. The amplified signal level is latched by the SR latch circuit 4 in one cycle from a falling edge to the next falling edge of the CLK_3 signal.

The SR latch circuits 3 and 4 are SR type latch circuits that respectively latch the output results from the input first stage circuits 1 and 2. The input first stage circuit 5 is a first stage circuit for CLK that receives the CLK signal and an inverted signal (CLK_bar) of the CLK signal.

The phase adjustment circuit 6 adjusts the phase of CLK_3 to be in phase as the clocks of the external CLK terminal. Note that CLK_3 is supplied to the input first stage circuits 1 and 2. The clock tree circuit (CTS) 7 is composed of a clock delay element which distributes CLK_3 to each data.

The latch circuits 8 and 9 internally latch the data using CLK_4. Specifically, the latch circuit 8 latches the output result (INT_1) from the SR latch circuit 3 at a falling edge of CLK_4. Further, the latch circuit 9 latches the output result from the SR latch circuit 4 at a rising edge of CLK_4.

Figure 2:
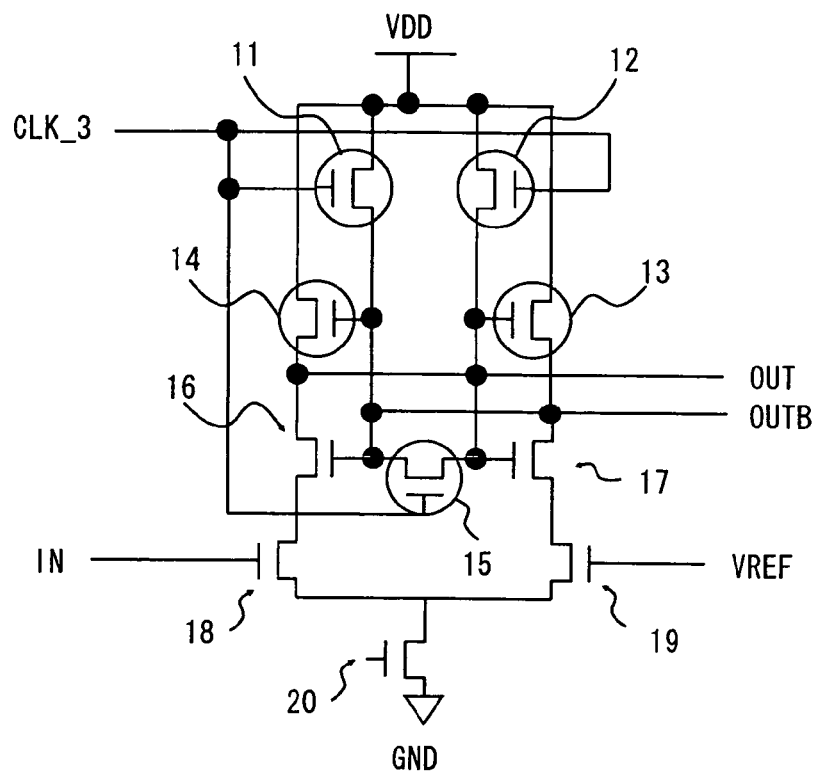
FIG. 2 is a block diagram illustrating an input first stage circuit according to the first exemplary embodiment.

FIG. 2 illustrates the input first stage circuits 1 and 2. As illustrated in FIG. 2, the input clock signal (CLK_3) is supplied respectively to the gates of Pch transistors 11, 12, and 15. An input signal IN and the input signal VREF are supplied to the gates of Nch transistors 18 and 19. Moreover, the source terminals of the Pch transistors 11, 12, 13, and 14 are connected to the power supply terminal VDD. The source terminal of an Nch transistor 20 is connected to GND.

An output terminal OUT is connected to the drain terminals of the Pch transistors 12, 14, and 15, the gates of the Pch transistor 13 and an Nch transistor 17, and the drain of an Nch transistor 16. An output terminal OUTB is connected to the drain terminals of the Pch transistors 11 and 13, the source terminal of the Pch transistors 15, the gates of the Pch transistor 14 and the Nch transistor 16, and the drain of the Nch transistor 17.

The source of the Nch transistor 16 is connected to the drain of the Nch transistor 18. The source of the Nch transistor 17 is connected to the drain of the Nch transistor 19. The drain of the Nch transistor 20 is connected to the sources of the Nch transistors 18 and 19.

Figure 3:
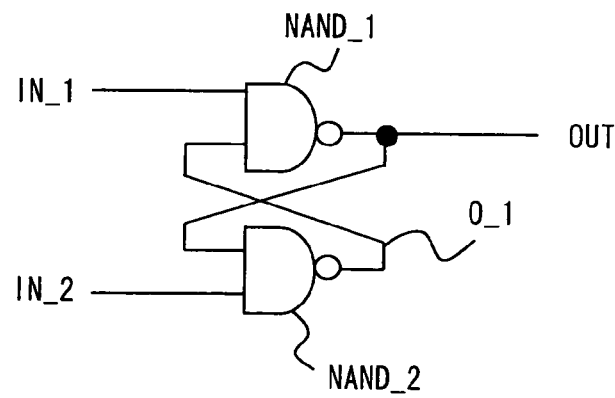
FIG. 3 is a block diagram illustrating an SR latch circuit according to the first exemplary embodiment.

FIG. 3 illustrates the SR latch circuits 3 and 4. As illustrated in FIG. 3, the SR latch circuits 3 and 4 receive the output results (OUT and OUTB) from the input first stage circuits 1 and 2 respectively as IN_1 and IN_2. NAND_1 receives IN_1 and O_1, and outputs OUT which is the output from the SR latch circuits 3 and 4. NAND_2 receives IN_2 and OUT, and outputs O_1.

Figure 4:
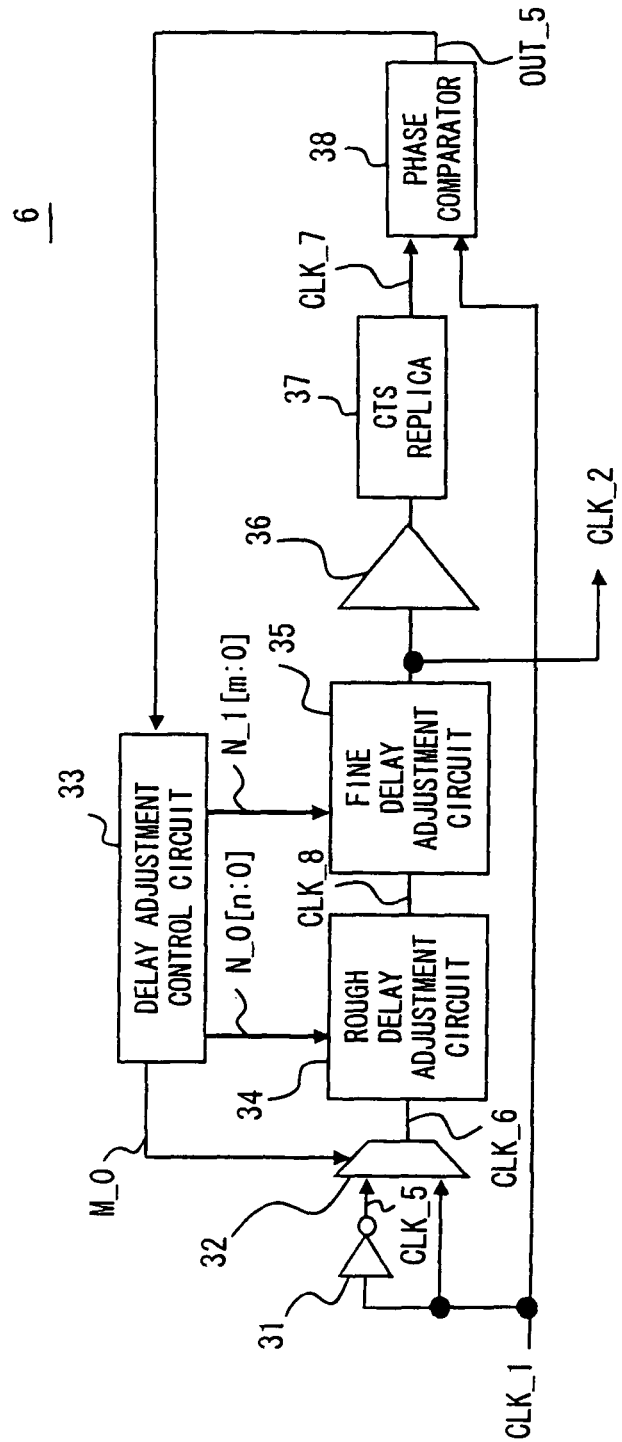
FIG. 4 is a block diagram illustrating a phase adjustment circuit according to the first exemplary embodiment.

FIG. 4 is a block diagram illustrating the detailed configuration of the phase adjustment circuit 6. The phase adjustment circuit 6 adjusts the phase of CLK_7 to be closer to the phase of CLK_1. The phase adjustment circuit 6 includes an inverter 31, a multiplexer 32, a delay adjustment control circuit 33, a rough delay adjustment circuit 34, a fine delay adjustment circuit 35, an input first stage circuit 36, a clock tree circuit (CTS replica) 37, and a phase comparator 38.

CLK_1 supplied to the phase adjustment circuit 6 is supplied to the inverter 31 and the multiplexer 32. The output from the inverter 31 is supplied to the multiplexer 32. CLK_5 is supplied to the multiplexer 32. Note that CLK_5 is an inverted clock passed through the inverter 31.

The multiplexer 32 is controlled by an output signal M_0 supplied from the delay adjustment control circuit 33. That is, the multiplexer 32 selects the output clock CLK_5 or CLK_1 from the inverter 31 according to the signal M_0.

The output signal (CLK_6) from the multiplexer 32 is supplied to the rough delay adjustment circuit 34. The output signal (CLK_8) from the rough delay adjustment circuit 34 is supplied to the fine delay adjustment circuit 35. The output signal (CLK_2) from the fine delay adjustment circuit 35 is supplied to the input first stage circuit 36, and also output as an output signal from the phase adjustment circuit 6. The output signal (CLK_7) which passed through the CTS replica 37 and CLK_1 are supplied to the phase comparator 38. The phase comparator 38 compares the phases of CLK_7 and CLK_1, and outputs a comparison result signal (OUT_5) to the delay adjustment control circuit 33.

The input first stage circuit 36 is a replica circuit of the input first stage circuit 5. The CTS replica 37 is a replica circuit of the CTS 7. Since the same clock delay as the CTS 7 is added in the CTS replica 37, the CTS replica 37 is composed of a clock signal replica element. That is, CLK_7 has the same amount of delay as CLK_3. Note that CLK_7 is obtained by the CLK_2 passing through the input first stage circuit 36 and the CTS replica 37, and CLK_3 is obtained by the external CLK passing through the input first stage circuit 5 and the CTS 7.

The delay adjustment control circuit 33 controls the multiplexer 32 in response to the phase comparison result in order to adjust the delay of the rough delay adjustment circuit 34 and the fine delay adjustment circuit 35. Thus the delay adjustment control circuit 33 outputs M_0, N_0[n:0], and N_1[n:0] as control signals.

Figure 5:
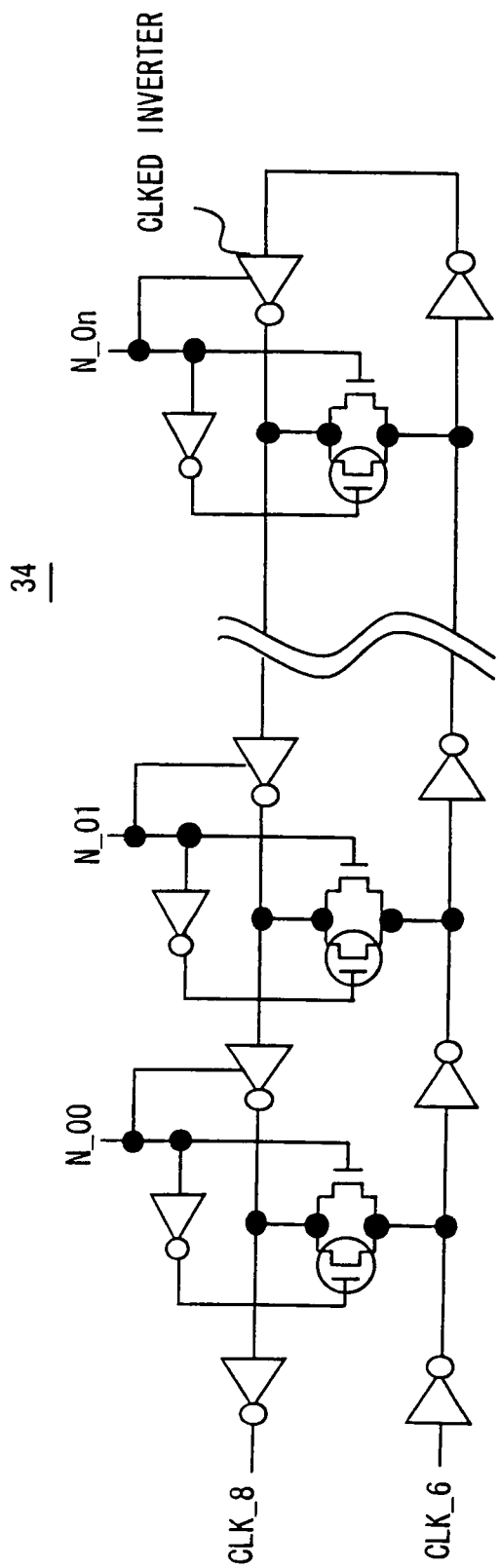
FIG. 5 is a block diagram illustrating a rough delay adjustment circuit according to the first exemplary embodiment.

FIG. 5 illustrates the rough delay adjustment circuit 34. The rough delay adjustment circuit 34 can adjust the delay of CLK_8 for CLK_6 in response to the value of the input signal N_0[n:0] which is supplied from the delay adjustment control circuit 33. In the example illustrated in FIG. 5, the size of the transistors is the same, and by increasing the number of N_0[n:0] to be High, the amount of delay of CLK_8 from the phase of CLK_6 can be increased. At the initial state, by setting only N_00 to be High, the minimum delay value is specified. Then, by sequentially setting N_01, N_02, ..., and N_0n to be High, the amount of delay can be increased.

Figure 6:
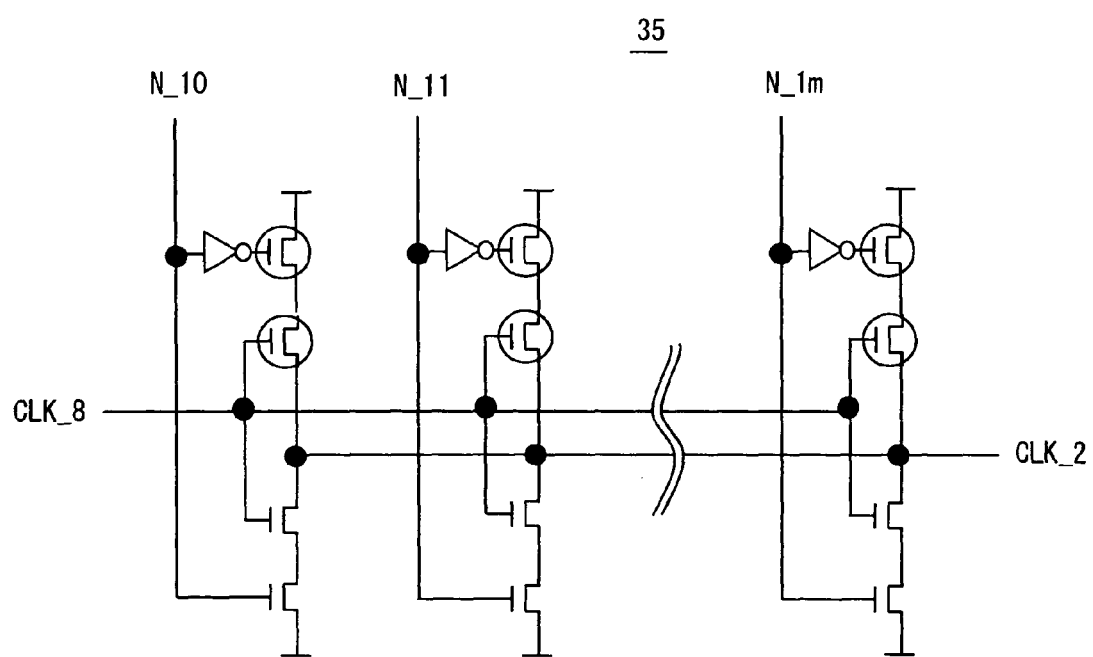
FIG. 6 is a block diagram illustrating a fine delay adjustment circuit according to the first exemplary embodiment.

FIG. 6 illustrates the fine delay adjustment circuit 35. The fine delay adjustment circuit 35 can adjust the delay of CLK_2 from CLK_8 in response to the value of the input signal N_1[n:0] which is supplied from the delay adjustment control circuit 33. In the example illustrated in FIG. 6, the size of the transistors is the same, and by increasing the number of N_0[n:0] to be Low, the delay amount of CLK_2 from the phase of CLK_8 can be increased. At the initial state, by setting all of N_1[n:0] to be High, the minimum delay value is specified. Then, by sequentially setting N_11, N_12, ..., N_1m to be Low, the amount of delay can be increased.

Figure 7:
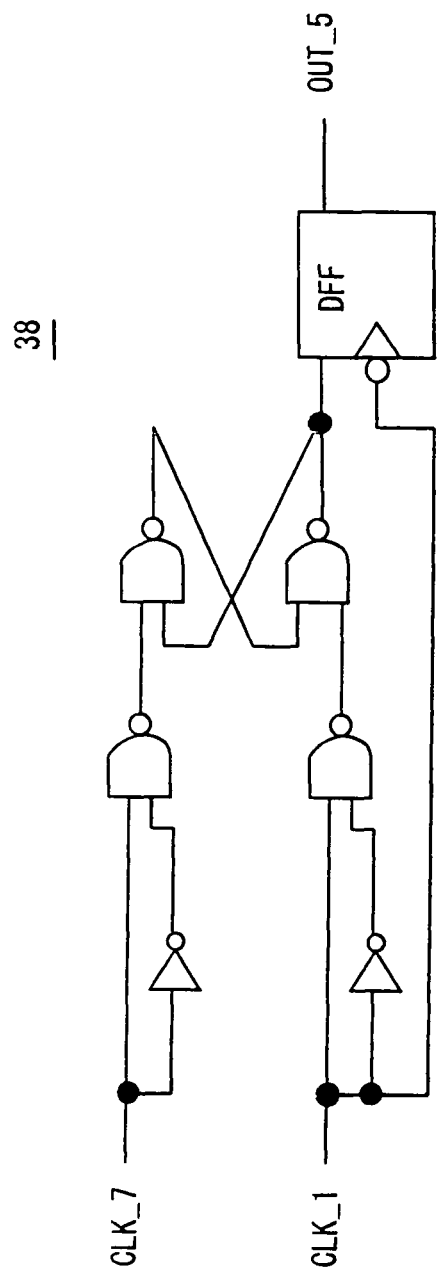
FIG. 7 is a block diagram illustrating a phase comparator according to the first exemplary embodiment.

FIG. 7 illustrates the phase comparator 38. The phase comparator 38 compares the phase of CLK_1 with the phase of CLK7 which has passed through the delay circuit. The phase comparator 38 outputs High as an output of OUT_5 if the phase of CLK_7 is delayed by 180 degrees or more from the phase of CLK_1. Further, the phase comparator 38 outputs Low as an output of OUT_5 if the phase delay is smaller than 180 degrees.

Figure 8:
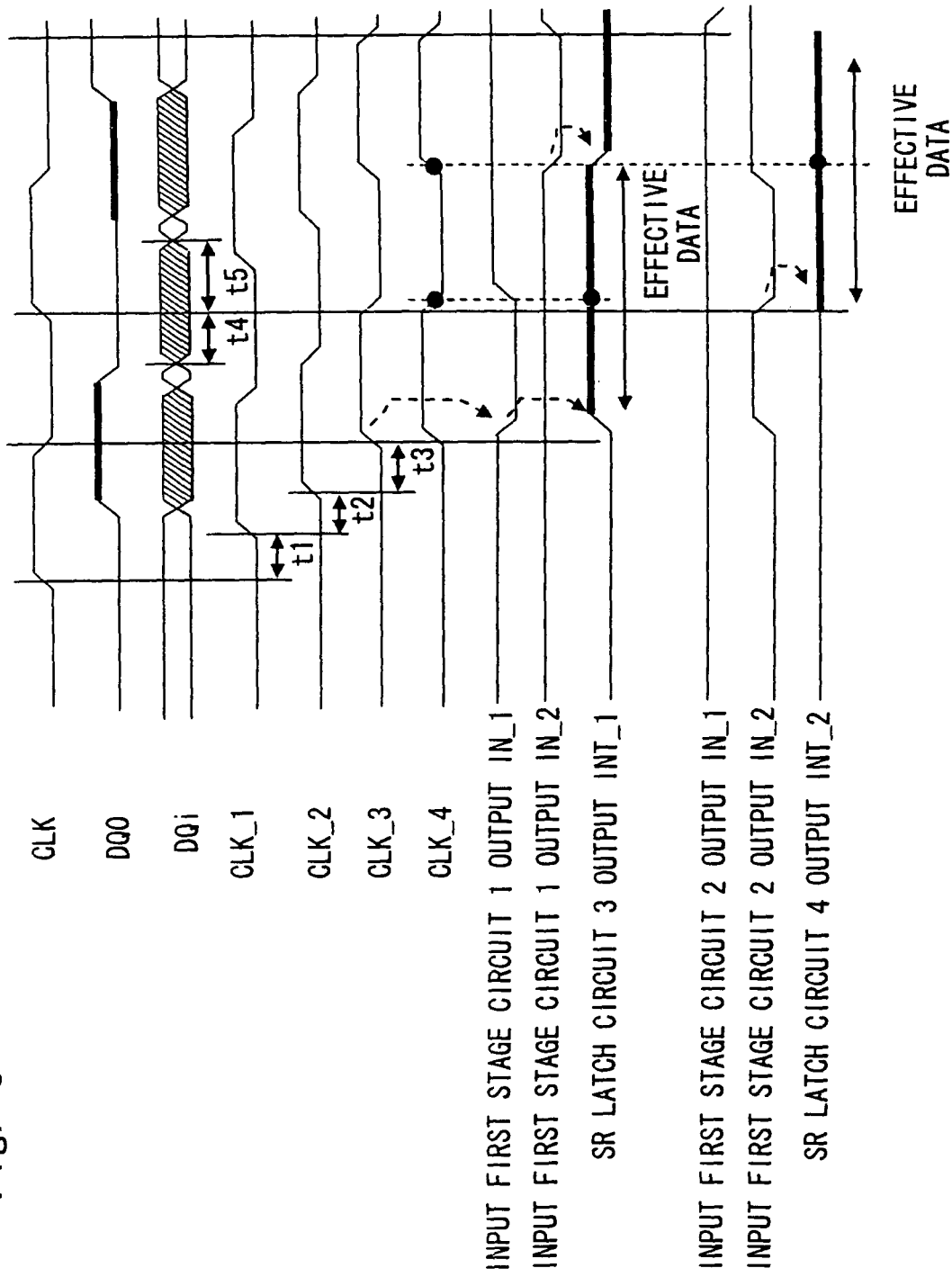
FIG. 8 is a waveform chart illustrating signals according to the first exemplary embodiment.

FIG. 8 illustrates waveforms of CLK, DQi, and internal signals in the input interface circuit 100. The data (DQi) for the input clock (CLK) is input to the DDR interface at the timing when ensuring the setup time (the time indicated by t4 in FIG. 4) and the hold time (the time indicated by t5 in FIG. 4) which are specified in the specification. Therefore, the phase adjustment circuit 6 needs to adjust the phase of CLK_3 to be in phase with CLK by the phase adjustment circuit 6 adjusting the delay time indicated by t2. Note that CLK_3 signal is supplied to the input first stage circuits 1 and 2. At this time, the delay time indicated by t1 is added when passing through the input first stage circuit 5, and the delay time indicated by t3 is added when passing through the CTS 7. The details of the phase adjustment operation by the phase adjustment circuit 6 are described later.

In FIG. 8, DQ0 is one data waveform of DQi. The part indicated by the thick lines in the waveform of DQ0 indicates the effective data in DQ0. First, the input first stage circuit 1 outputs IN_1 and IN_2 which are the comparison result signals between DQ0 and VREF in the input first stage circuit 1 at a rising edge of CLK_3. The SR latch circuit 3 outputs the effective data to the latch circuit 8 according to IN_1 and IN_2 supplied from the input first stage circuit 1. The SR latch circuit 8 latches the effective data at a falling edge of CLK_4. On the other hand, the input first stage circuit 2 outputs IN_1 and IN_2 which are the comparison result signals between DQ0 and VREF in the input first stage circuit 2 at a falling edge of CLK_3. The SR latch circuit 4 outputs the effective data to the latch circuit 9 according to IN_1 and IN_2 supplied from the input first stage circuit 2. The SR latch circuit 9 latches the effective data at a rising edge of CLK_4.

Note that it is assumed that if the phase adjustment circuit 6 is in the initial state, the multiplexer 32 is configured to let CLK_1 pass through, and the rough delay adjustment circuit 34 and the fine delay adjustment circuit 35 are configured to output a minimum delay value. For this reason, at the initial state, if the delay in the phase adjustment circuit 6 is zero (that is, in case of t2=0), the phase of CLK_3 is delayed by t1+t3 from the phase of CLK_1.

Figure 9:
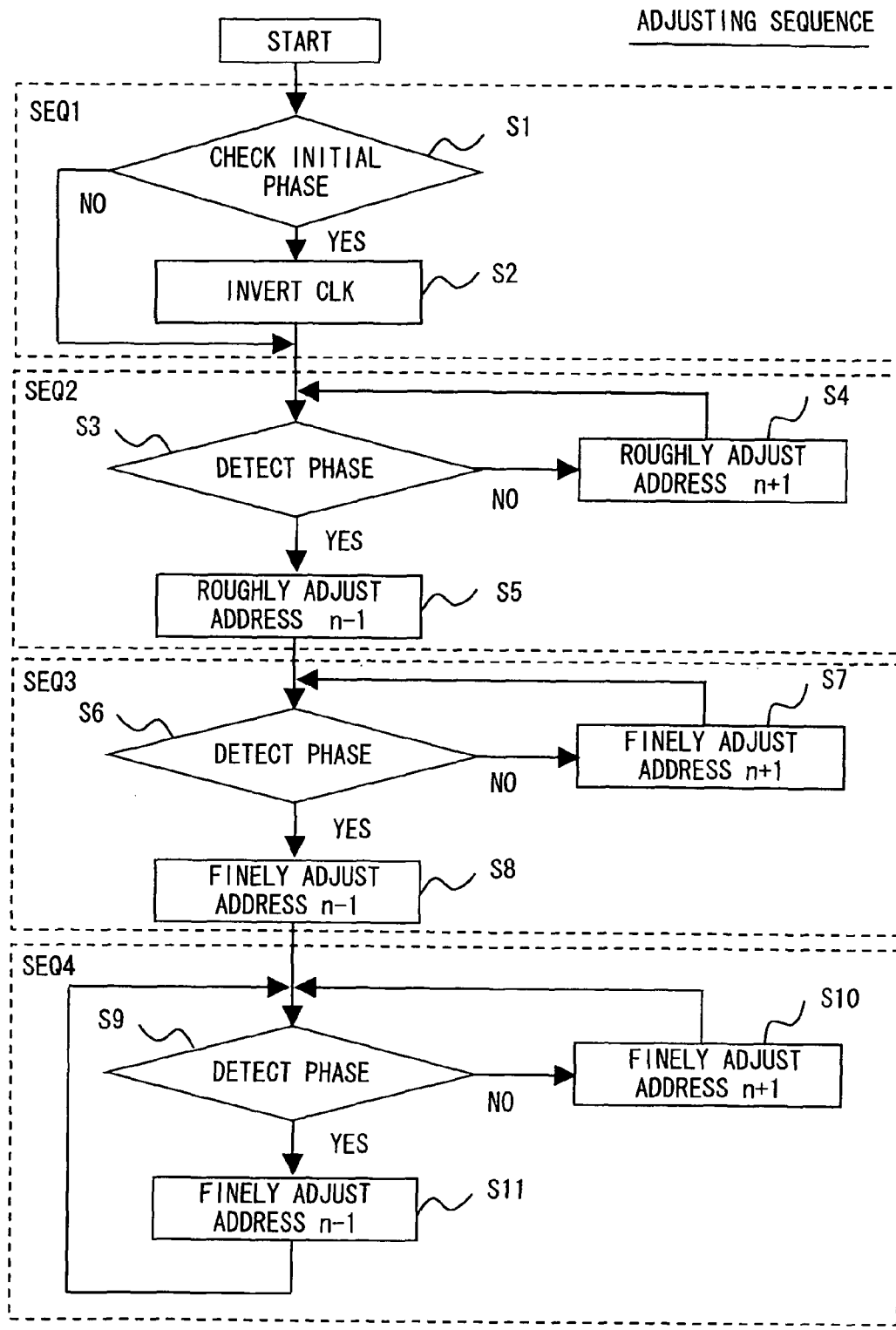
FIG. 9 is a flowchart illustrating a delay adjusting sequence by a delay adjustment control circuit according to the first exemplary embodiment.

Next, the phase adjustment operation according to the first exemplary embodiment of the present invention is explained with reference to FIG. 9. FIG. 9 illustrates the sequence of the delay adjustment by the delay adjustment control circuit 33.

In SEQ1, when the delay adjustment control circuit 33 starts to operate, the delay adjustment control circuit 33 checks the initial phase (S1). In this example, it is assumed that the phase comparator 38 outputs High if the phase of CLK_7 is delayed by 180 degrees or more from the phase of CLK_1. Further, the phase comparator 38 outputs Low if the phase delay is less than 180 degrees.

As a result of the phase check, if the phase of CLK_7 is delayed by less than 180 degrees than the phase of CLK_1 (in case of YES in S1), the delay adjustment control circuit 33 controls the multiplexer 32 to output an inverted signal of CLK_1 (S2) (that is, the value of M_0 is controlled to make the multiplexer 32 select the output (CLK_5) from the inverter 31).

Normally, if the phase of CLK_7 is delayed by less than 180 degrees than the phase of CLK_1, the delay adjustment of 180 degrees or more is required to equalize the phase relationship between CLK_7 and CLK_1. Therefore, by evaluating and inverting the phase in SEQ1, the phase comparator 38 always outputs High (the phase of CLK_7 is delayed by 180 degrees or more than the phase of CLK_1) at the initial state of SEQ2.

Next, in SEQ2, the phase of CLK_7 is detected from the output result by the phase comparator 38 (S3). As a result of the phase detection, if the phase of CLK_7 is delayed by 180 degrees or more than the phase of CLK_1 (if the output from the phase comparator 38 is High, that is NO in S3), the delay value of the rough delay adjustment circuit 34 is increased until the output from the phase comparator 38 becomes Low. For example, if the control signal up to the nth transistor of the rough delay adjustment circuit 34 is High, the control signal of the next transistor address (n+1th address) is set to High. As described above, at the initial state of SEQ2, the output from the phase comparator 38 is High. Thus the delay value of the rough delay adjustment circuit 34 is increased from this state until the output from the phase comparator 38 becomes Low (S4).

Then, if the output from the phase comparator 38 becomes Low, the delay value of the rough delay adjustment circuit 34 is set to the previous delay value before the output from the phase comparator 38 becomes Low (S5). For example, when the control signal up to the nth transistor of the rough delay adjustment circuit 34 is High, the control signal of the nth transistor is set to Low, so that the control signal up to the address of the previous transistor (n–1th transistor) will be High. Note that also at the initial state of SEQ3, the output from the phase comparator 38 is High.

Next, in SEQ3, the phase of CLK_7 is detected from the output result by the phase comparator 38 (S6). As a result of the phase detection, if the phase of CLK_7 is delayed by 180 degrees or more than the phase of CLK_1 (if the output from the phase comparator 38 is High, that is NO in S6), the delay value of the fine delay adjustment circuit 35 is increased until the output from the phase comparator 38 becomes Low (until obtaining YES in S6) (S7). For example, when the control signal up to the nth transistor of the fine delay adjustment circuit 35 is Low, the control signal of the address of the next transistor (n+1th transistor) is set to Low.

Then, at the time when the output from the phase comparator 38 becomes Low, the delay value of the fine delay adjustment circuit 35 is set to the previous delay value before the output of the phase comparator 38 becomes Low (S8). For example, when the control signal up to the nth transistor of the fine delay adjustment circuit 35 is Low, the control signal of the nth transistor is set to High, so that the control signal up to the address of the previous transistor (n–1th transistor) will be Low.

Further, in SEQ4, the phase comparator 38 corrects the phase while performing constant detection of the phase (S9, 10, and 11). In SEQ4, the fine delay adjustment circuit 35 adjusts the delay so that the phase of CLK_7 follows the phase of CLK_1.

As explained above, by including a latch type input first stage circuit as an input interface, (that is, by including the SR latch circuits 3 and 4, and the phase adjustment circuit 6 adjusting the external CLK and CLK3 supplied to the SR latch circuits 3 and 4 to be in phase), it is possible to ignore the influence of the delay in the first stage circuit and the following circuits which has traditionally been generating the jitter and the duty cycle distortion.

Further, in the initial state of the delay adjustment control circuit 33, if CLK_7 which passed through the first stage circuit 36 has not proceeded by 180 degrees or more than CLK_1 of the CLK input terminal, the initial phase is inverted. If the phase has proceeded by 180 degrees or more, the phase is not inverted but CLK_7 passes through the input first stage circuit 36. Thus, the amount of delay adjusted by the phase adjustment circuit 6 can be reduced.

This suppresses the jitter generated in the delay circuit and the duty cycle distortion, thereby enabling to favorably ensure the effective setup and hold characteristics which are needed for the latch circuits 8 and 9.

Second Exemplary Embodiment

Figure 10:
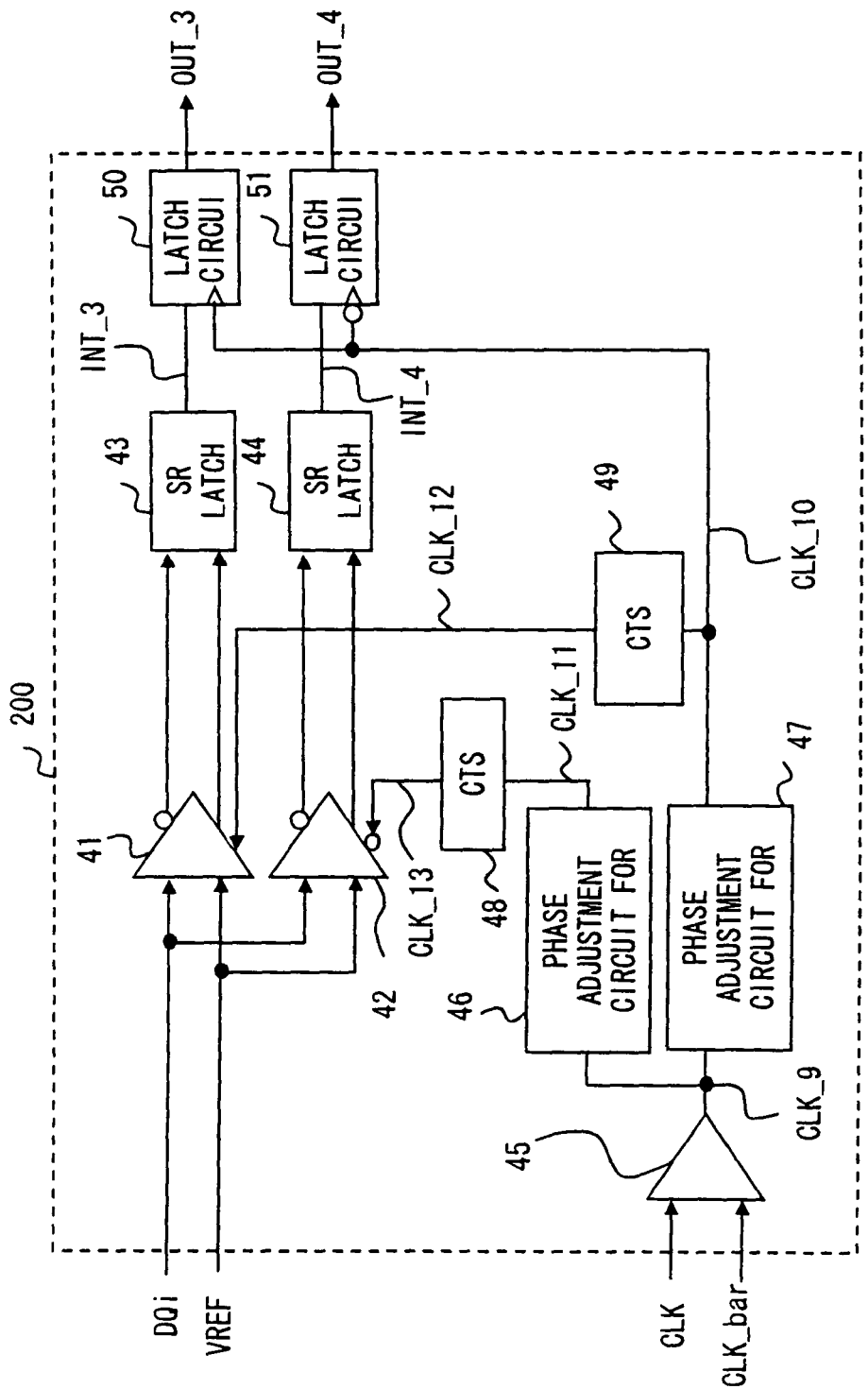
FIG. 10 is a block diagram illustrating an input interface circuit according to a second exemplary embodiment.
Figure 11:
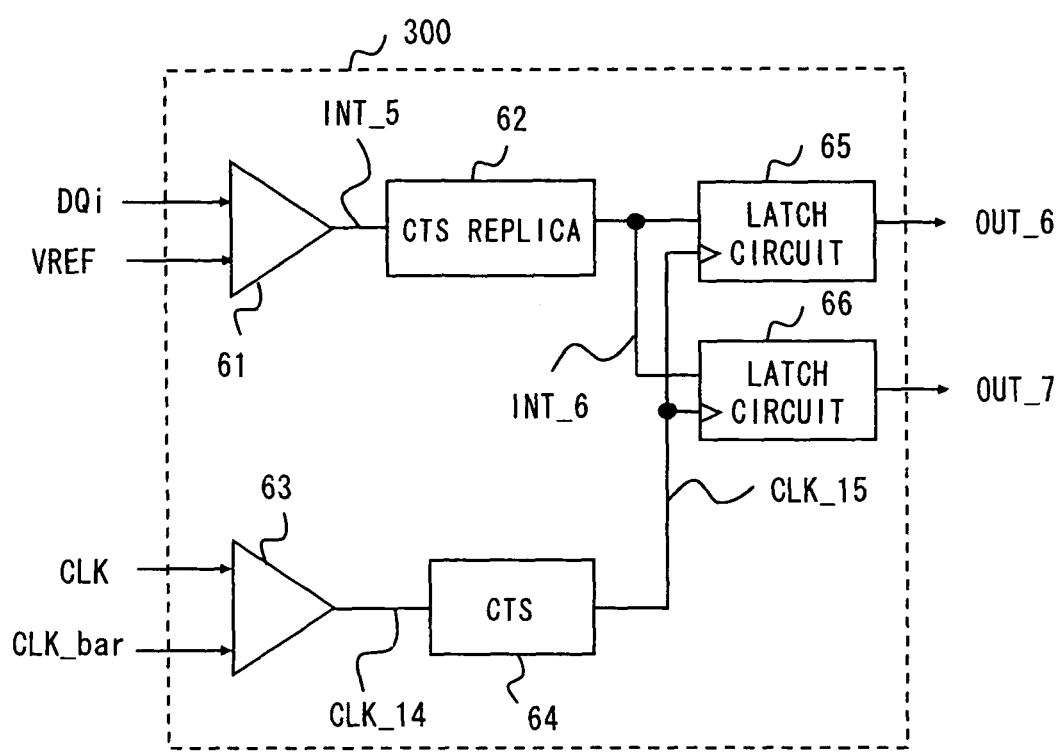
FIG. 11 is a block diagram illustrating a general input interface circuit concerning the present invention.
Figure 12:
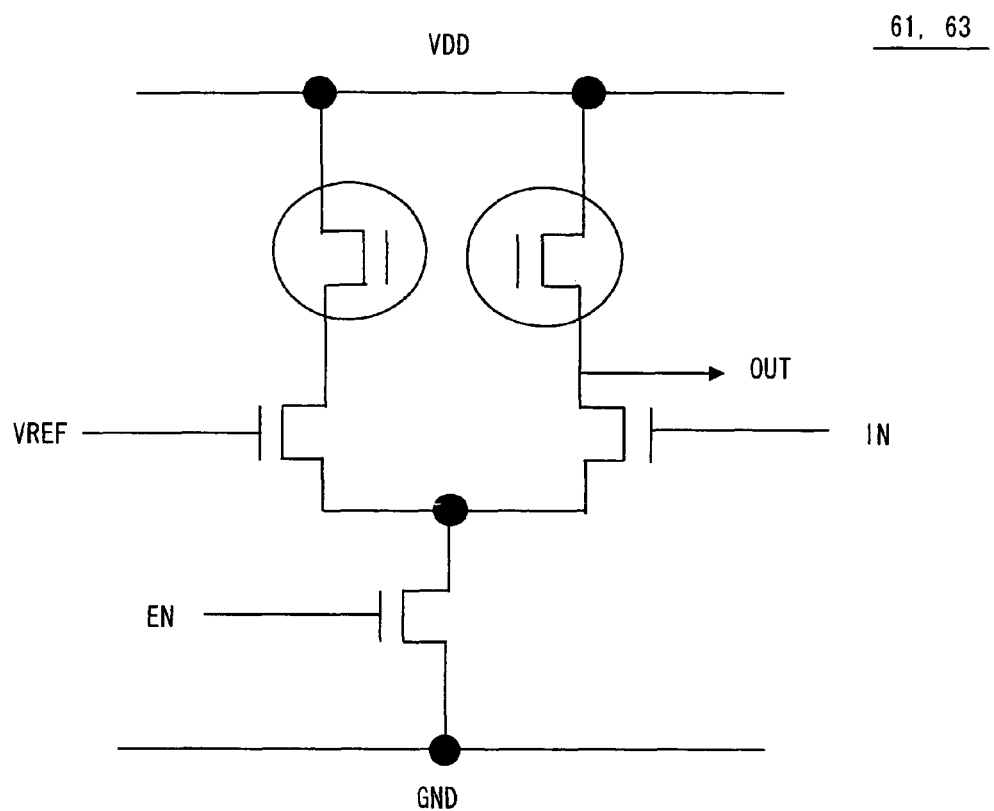
FIG. 12 is a block diagram illustrating an input first stage circuit concerning the present invention.
Figure 13:
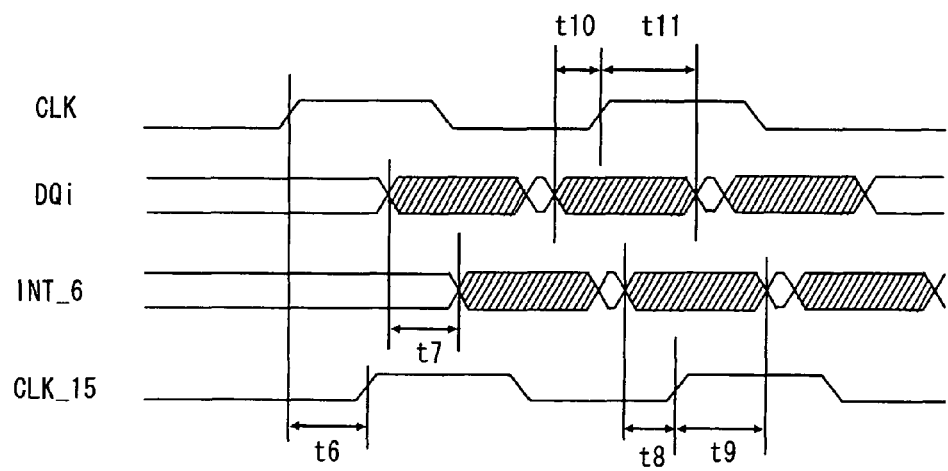
FIG. 13 is a waveform chart illustrating signals in the input interface circuit concerning the present invention.
Figure 14:
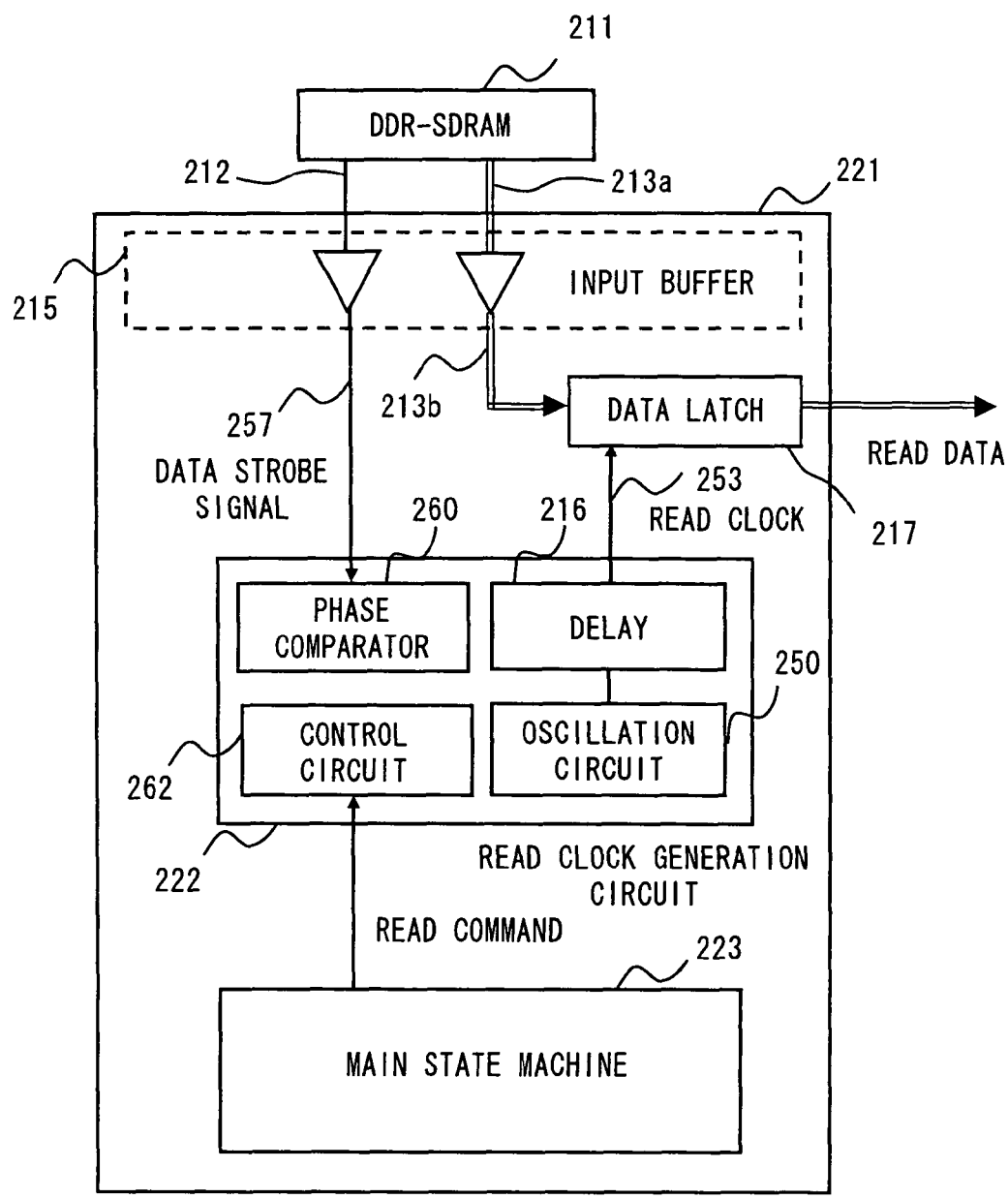
FIG. 14 is a block diagram illustrating an input interface circuit according to a prior art.

FIG. 10 is a block diagram illustrating an input interface circuit according to the second exemplary embodiment. As compared with the input interface circuit 100 illustrated in FIG. 1, the input interface circuit 200 includes a phase adjustment circuit for falling CLK (phase adjustment circuit for falling edge) 46 and a phase adjustment circuit for rising CLK (phase adjustment circuit for rising edge) 47 instead of the phase adjustment circuit 6. Note that the configuration of the input first stage circuits 41 and 42 is identical to that of the input first stage circuits 1 and 2 illustrated in FIG. 1, the configuration of the SR latch circuits 43 and 44 is identical to that of the SR latch circuits 3 and 4, the configuration of the input first stage circuit 45 is identical to that of the input first stage circuit 5, the configuration of the CTSs 48 and 49 is identical to that of the CTS 7, and the configuration of the latch circuits 50 and 51 is identical to that of the latch circuits 8 and 9. Thus the explanation is omitted here.

In the input interface circuit 100 illustrated in FIG. 1, the phase comparator 38 detects only the rising edges of CLK_7 in CLK_1 for the signals compared by the phase comparator 38. For this reason, the falling edges of CLK_2 output from the phase adjustment circuit 6 cannot be correctly aligned. Therefore, the phase of the falling edges of CLK_3 supplied to the input first stage circuit 2 may be shifted as compared with the phase of the falling edges of CLK_1.

On the other hand, the input interface circuit 200 illustrated in FIG. 10 can align both edges (edges of CLK_12 and CLK_13) supplied to the input first stage circuits 41 and 42 to the phase of CLK_9 by the phase adjustment circuits 46 and 47 respectively for the delay of the falling and rising edges.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:
1. An input interface circuit comprising:
   an input first stage circuit that is connected to a signal terminal, the signal terminal receiving external data; and
   a phase adjustment circuit that adjusts an external input clock and a latch timing signal to be in phase, the latch timing signal being output to a latch circuit included in the input first stage circuit,
   wherein the phase adjustment circuit adjusts a delay time of the latch timing signal that passes through a clock tree circuit and is supplied to the latch circuit in response to a comparison result between the external input clock and an output from a replica delay circuit which is replicated from the external input clock,
   wherein the phase adjustment circuit comprises:
      a delay adjustment circuit that adjusts a delay time of the external input clock;
      a replica clock tree circuit that receives the external input clock having the delay time adjusted by the delay adjustment circuit, the replica clock tree circuit being a replica of the clock tree circuit;
      a phase comparator that compares an output result from the replica clock tree circuit and a phase of the external input clock;
      a delay adjustment control circuit that adjusts an amount of delay of the delay adjustment circuit in response to a comparison result by the phase comparator; and a multiplexer that receives the external input clock and an inverted signal of the external input clock, and outputs a selected signal to the delay adjustment circuit, and wherein the delay adjustment control circuit controls the multiplexer in response to the comparison result by the phase comparator.

2. The input interface circuit according to claim 1, wherein the delay adjustment circuit comprises:

a rough delay adjustment circuit that roughly adjusts the delay time of the external input clock; and a fine delay adjustment circuit that finely adjusts the delay time of the external input clock, and wherein the rough delay adjustment circuit roughly adjusts the delay time of the external input clock, and after that, the fine delay adjustment circuit finely adjusts the delay time of the external input clock.

3. The input interface circuit according to claim 1, wherein the input first stage circuit comprises a first latch circuit and a second latch circuit, and wherein the phase adjustment circuit further comprises:

a first phase adjustment circuit that adjusts the delay time of the latch timing signal in response to a comparison result between a rising edge of the external input clock and the output from the replica delay circuit which is replicated from the external input clock, the latch timing signal passing through a first clock tree circuit and being supplied to a first latch circuit; and a second phase adjustment circuit that adjusts the delay time of the latch timing signal in response to a comparison result between a falling edge of the external input clock and the output from the replica delay circuit which is replicated from the external input clock, the latch timing signal passing through the clock tree circuit and being supplied to a second latch circuit.

4. The input interface circuit according to claim 1, wherein the phase adjustment circuit controls the multiplexer to select one of the external input clock and the inverted signal as the selected signal.

* * * * *